US012808932B2

(12) United States Patent
Tiwari

(10) Patent No.: US 12,808,932 B2
(45) Date of Patent: Nov. 24, 2026

(54) VOLTAGE DROOP MITIGATION DURING AUTOMOTIVE ELECTRONICS BUILT IN SELF TEST

(71) Applicant: QUALCOMM Incorporated, San Diego, CA (US)

(72) Inventor: Rajesh Kumar Tiwari, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 86 days.

(21) Appl. No.: 18/960,786

(22) Filed: Nov. 26, 2024

(65) Prior Publication Data

US 2026/0147039 A1 May 28, 2026

(51) Int. Cl.
*G01R 31/317* (2006.01)
*H03K 19/173* (2006.01)
*H03K 21/02* (2006.01)

(52) U.S. Cl.
CPC . *G01R 31/31724* (2013.01); *G01R 31/31701* (2013.01); *G01R 31/31727* (2013.01); *H03K 19/1737* (2013.01); *H03K 21/02* (2013.01)

(58) Field of Classification Search
None
See application file for complete search history.

(56) References Cited

U.S. PATENT DOCUMENTS

2012/0187991 A1* 7/2012 Sathe ..................... H03K 5/135 327/158
2018/0183417 A1* 6/2018 Ho ........................... H03K 5/05
2019/0212387 A1 7/2019 Gangwal et al.
2022/0147096 A1* 5/2022 Kim .......................... G06F 1/08

FOREIGN PATENT DOCUMENTS

EP 4152018 A1 3/2023

OTHER PUBLICATIONS

International Search Report and Written Opinion—PCT/US2025/050937—ISA/EPO—Apr. 20, 2026.

* cited by examiner

*Primary Examiner* — Jany Richardson
(74) *Attorney, Agent, or Firm* — Loza & Loza LLP

(57) ABSTRACT

Aspects of the disclosure are directed to variable shift frequency implementation. In accordance with one aspect, the disclosure includes synthesizing a divided clock from a shift clock with a divided frequency equal to a reference frequency divided by a selected integer divisor in a logical built-in self-test (LBIST) mode; transitioning the LBIST mode from a shift state to a capture state by enabling a capture control enable signal while pacing with the divided clock; generating a stretched capture control enable signal from the capture control enable signal using a slow cycle programmer (SCP) with a plurality of quad stage pipelines; and transitioning the LBIST mode from the capture state to a subsequent shift state with the stretched capture control enable signal in a HIGH state to mitigate voltage droop.

19 Claims, 14 Drawing Sheets

200

VOLTAGE DROOP MITIGATION DURING AUTOMOTIVE ELECTRONICS BUILT IN SELF TEST

TECHNICAL FIELD

This disclosure relates generally to the field of automotive electronics systems, and, in particular, to voltage droop mitigation within an automotive electronics system using a variable shift frequency generator.

BACKGROUND

Automotive electronics systems may include a plurality of processing engines, processors or processing cores for user applications. The automotive electronics system may require a self-test mode which interrupts an operational mode. The self-test mode may be susceptible to voltage droop upon its initiation. Thus, there is a motivation to implement a more robust, but rapid self-test mode to minimize operational mode timeline impacts.

SUMMARY

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

In one aspect, the disclosure provides a variable shift frequency implementation in logical built-in self-test (LBIST) mode. Accordingly, the present disclosure discloses an apparatus including: a clock divider configured to generate a divided clock; a glitch-free multiplexer coupled to the clock divider, the glitch-free multiplexer configured to output the divided clock; and a slow cycle programmer (SCP) coupled to the glitch-free multiplexer, the SCP configured to generate a stretched capture control enable signal from a capture control enable signal, wherein the stretched capture control enable signal extends an active state for the divided clock for an extension duration across a capture state to a subsequent shift state.

In one example, the divided clock includes a divided frequency equal to a reference frequency divided by a selected integer divisor in a logical built-in self-test (LBIST) mode. In one example, the SCP comprises a plurality of quad stage pipelines, wherein each of the plurality of quad stage pipelines is a cascaded delay module of circuit delay stages. In one example, the plurality of quad stage pipelines is configured in a cascaded serial manner to implement a programmable pipeline delay.

In one example, the apparatus further includes a user data register (UDR) coupled to the glitch-free multiplexer, the UDR configured to determine an active quantity of the plurality of quad stage pipelines based on a predefined parameter. In one example, the apparatus further includes an output multiplexer coupled to the plurality of quad state pipelines, the output multiplexer configured to enable an active quantity of the plurality of quad state pipelines based on an external signal. In one example, the external signal is received from a user data register (UDR) and the external signal carries a user defined parameter.

Another aspect of the disclosure provides an apparatus including: means for initializing a digital logic system in an operational mode paced by a shift clock at a reference frequency; means for redirecting the digital logic system from the operational mode to a logical built-in self-test (LBIST) mode; means for synthesizing a divided clock from the shift clock with a divided frequency equal to the reference frequency divided by a selected integer divisor in the LBIST mode; means for transitioning the LBIST mode from a shift state to a capture state by enabling a capture control enable signal while pacing with the divided clock; means for generating a stretched capture control enable signal from the capture control enable signal using a slow cycle programmer (SCP) with a plurality of quad stage pipelines; means for transitioning the LBIST mode from the capture state to a subsequent shift state with the stretched capture control enable signal in a HIGH state to mitigate voltage droop; and means for redirecting the digital logic system from the LBIST mode to the operational mode.

In one example, the stretched capture control enable signal extends an active state for an extension duration across the capture state to the subsequent shift state. In one example, the extension duration is determined by a quantity of the plurality of quad stage pipelines.

Another aspect of the disclosure provides a method including: synthesizing a divided clock from a shift clock with a divided frequency equal to a reference frequency divided by a selected integer divisor in a logical built-in self-test (LBIST) mode; transitioning the LBIST mode from a shift state to a capture state by enabling a capture control enable signal while pacing with the divided clock; generating a stretched capture control enable signal from the capture control enable signal using a slow cycle programmer (SCP) with a plurality of quad stage pipelines; and transitioning the LBIST mode from the capture state to a subsequent shift state with the stretched capture control enable signal in a HIGH state to mitigate voltage droop.

In one example, the stretched capture control enable signal extends an active state for an extension duration across the capture state to the subsequent shift state. In one example, the extension duration is determined by a quantity of the plurality of quad stage pipelines from the slow cycle programmer (SCP).

In one example, the method further includes selecting the selected integer divisor from a plurality of programmable integer divisors. In one example, the plurality of programmable integer divisors includes 2, 3, 4, and 8. In one example, a quantity of the plurality of programmable integer divisors is a maximum integer divisor to restrict a delay of the plurality of quad stage pipelines to a maximum delay value. In one example, the divided frequency of the divided clock is at a slower frequency than the reference frequency of the shift clock.

In one example, the method further includes redirecting a digital logic system from an operational mode to the LBIST mode. In one example, the method further includes initializing the digital logic system in the operational mode paced by the shift clock at the reference frequency. In one example, the method further includes redirecting the digital logic system from the LBIST mode to the operational mode.

These and other aspects of the present disclosure will become more fully understood upon a review of the detailed description, which follows. Other aspects, features, and implementations of the present disclosure will become apparent to those of ordinary skill in the art, upon reviewing the following description of specific, exemplary implementations of the present invention in conjunction with the accompanying figures. While features of the present invention may be discussed relative to certain implementations and figures below, all implementations of the present invention can include one or more of the advantageous features discussed herein. In other words, while one or more implementations may be discussed as having certain advantageous features, one or more of such features may also be used in accordance with the various implementations of the invention discussed herein. In similar fashion, while exemplary implementations may be discussed below as device, system, or method implementations it should be understood that such exemplary implementations can be implemented in various devices, systems, and methods.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

While for purposes of simplicity of explanation, the methodologies are shown and described as a series of acts, it is to be understood and appreciated that the methodologies are not limited by the order of acts, as some acts may, in accordance with one or more aspects, occur in different orders and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with one or more aspects.

Figure 1:
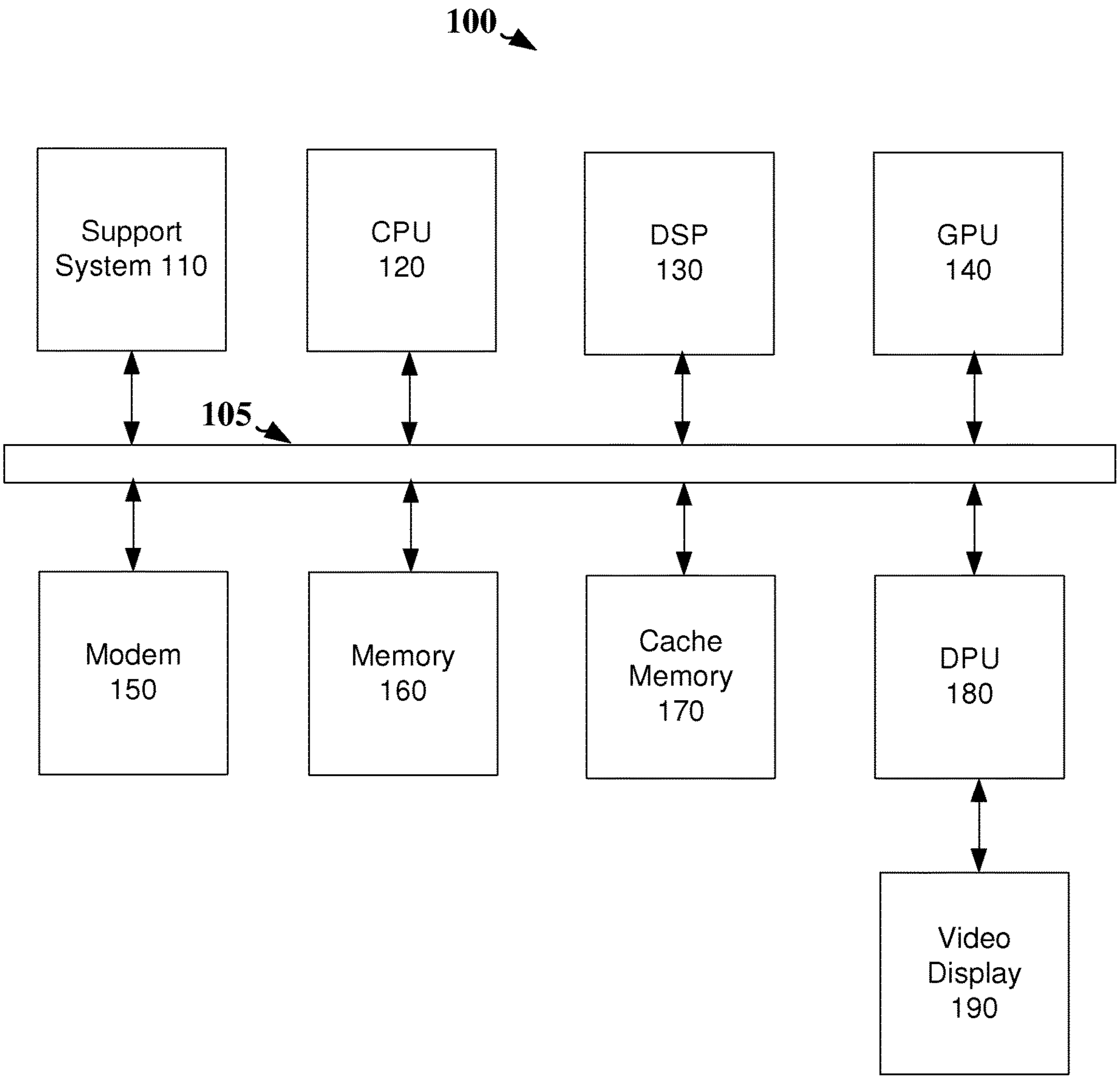
FIG. 1 illustrates an example information processing system for automotive electronics.

FIG. 1 illustrates an example information processing system 100 for automotive electronics. In one example, the information processing system 100 includes a plurality of processing engines such as a central processing unit (CPU) 120, a digital signal processor (DSP) 130, a graphics processing unit (GPU) 140, a display processing unit (DPU) 180, etc. In one example, various other functions in the information processing system 100 may be included such as a support system 110, a modem 150, a memory 160, a cache memory 170 and a video display 190. For example, the plurality of processing engines and various other functions may be interconnected by an interconnection databus 105 to transport data and control information. In one example, the CPU 120 may serve as a controller or a microcontroller of other processing engines. In one example, the controller or microcontroller may reallocate tasks from one processing engine to another.

In one example, the memory 160 and/or the cache memory 170 may be shared among the CPU 120, the GPU 140 and the other processing engines. In one example, the CPU 120 may include a first internal memory which is not shared with the other processing engines. In one example, the GPU 140 may include a second internal memory which is not shared with the other processing engines. In one example, any processing engine of the plurality of processing engines may have an internal memory (i.e., a dedicated memory) which is not shared with the other processing engines. Although several components of the information processing system 100 are included herein, one skilled in the art would understand that the components listed herein are examples and are not exclusive. Thus, other components may be included as part of the information processing system 100 within the spirit and scope of the present disclosure.

In one example, one or more processing engines in the information processing system 100 may be aggregated into a single integrated circuit known as a system on a chip (SOC). In one example, the SOC may include the central processing unit (CPU) 120 and other processing engines such as the DSP 130 or the GPU 140. The SOC may also include the memory 160 and the cache memory 170.

In one example, an automobile electronics system includes a system test and diagnostics mechanism, for example, a built-in self-test (BIST) mode (i.e., a test mode). The system test and diagnostic mechanism may be needed for compliance with an international automotive safety standard, ISO 26262 (Road vehicles—Functional safety) which provides guidelines for automotive safety requirements, including diagnostic testing. Typically, the BIST mode is interleaved with an operational mode. Hence, there is motivation to minimize the BIST mode timeline impact on the operational mode.

One form of the BIST mode is a logical BIST (LBIST) mode which may be used to diagnose faults in logical circuitry, for example, permanent faults. In one example, the LBIST mode may be executed at startup, prior to an operational mode.

In one example, the LBIST mode may use an on-die digital pattern generator, such as a pseudo random pattern generator (PRPG), and a response compactor, such as a multiple input signature register (MISR). In one example, the LBIST mode relies on the logical circuitry to be free of unknown states (e.g., X-free) and to be testable with random patterns. In one example, these properties may entail significant design overhead and effort. In one example, high fault coverage may be difficult to achieve, test times may be lengthy and only simple fault models (e.g., stuck states) may be targeted.

In one example, a hardware-enabled LBIST mode is a finite state machine (FSM)-based BIST trigger mechanism. For example, the hardware-enabled LBIST mode may use an on-chip clock generator for both setting a configuration and performing a LBIST test. In one example, LBIST test patterns may be encoded as a memory image and stored into a memory (e.g., ROM or RAM). In one example, memory content may be read by a LBIST driver for decoding and transport to a processing engine through a data interface (e.g., IEEE 1500 test interface). In one example response compactor (e.g., MISR) values may be collected by the LBIST driver and compared to a reference signature stored within the memory image for determination of a pass or fail status.

In one example, voltage droop during a transition from operational mode to LBIST mode may limit an operational shift frequency and increase an LBIST mode test duration. In one example, the voltage droop is dependent on a derivative of a current load over time (i.e., di/dt) during a mode transition. For example, the voltage droop may be more prevalent in a smaller voltage island or with large circuit gate counts due to a simultaneous current transient. In one example, the voltage droop may be more pronounced with a transition from zero activity to high activity.

In one example, an on-chip hardware-based approach for executing LBIST test scan patterns during the LBIST mode may reduce peak voltage drop during a test scan shift. In one example, the on-chip hardware-based approach may employ a stepped-down shift frequency profile at a commencement of each test scan load procedure and each test scan unload procedure. For example, the on-chip hardware-based approach may be used for a plurality of automotive use cases, such as advanced driver assistance system (ADAS) per ISO 26262.

Figure 2:
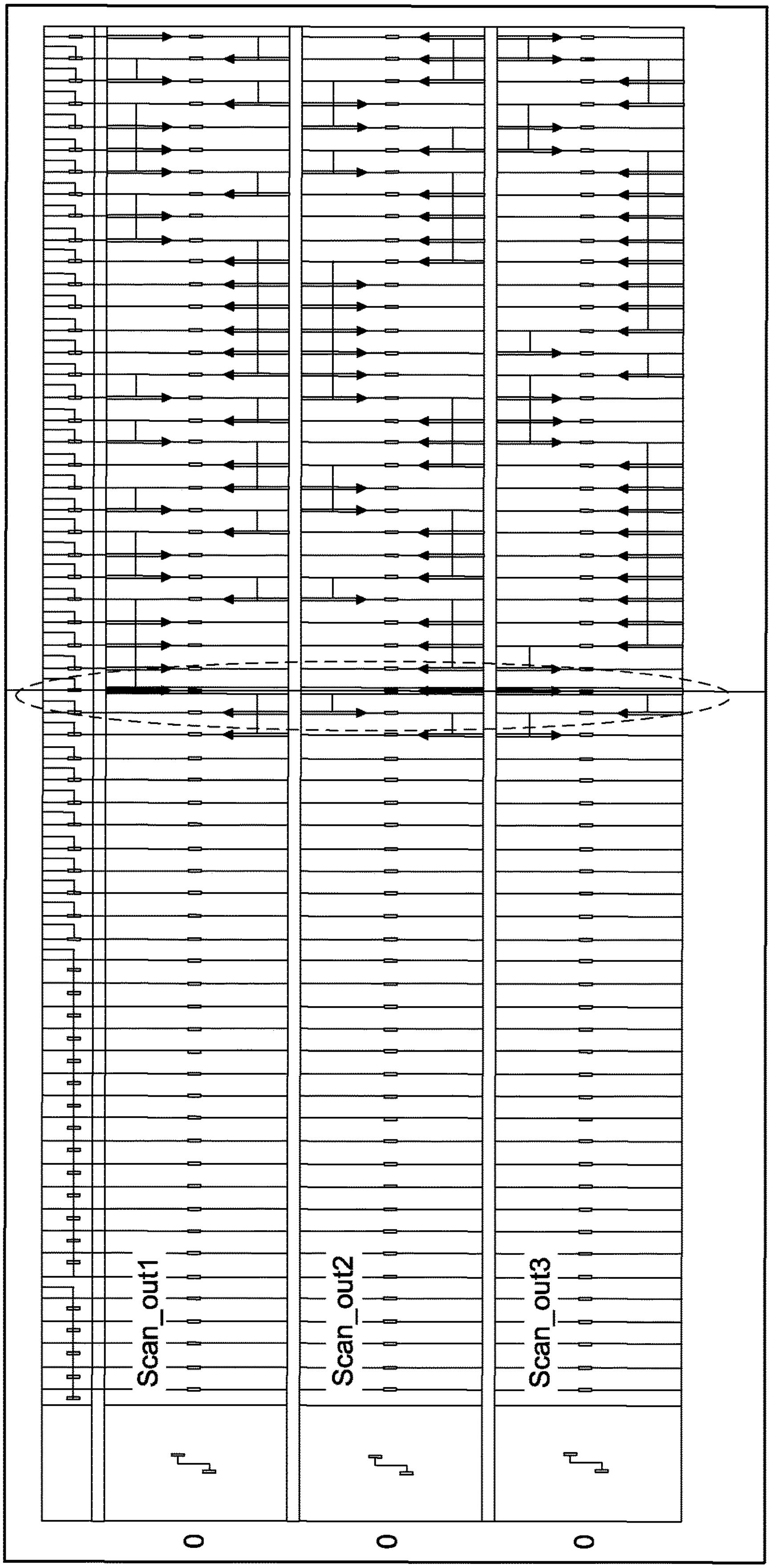
FIG. 2 illustrates example tester waveforms.

FIG. 2 illustrates example tester waveforms 200. In one example, the example tester waveforms 200 for a low pass audio subsystem (LPASS) and audio hard macros (HMs) include timing patterns which meet timing margins (e.g., for metal tapeout (MTO), prior to manufacturing) with a 100 MHz clock frequency and timing patterns which fail timing margins with a 125 MHz clock frequency. In one example, failures occur in the first 3 or 4 data load/unload cycles and failure recoveries occur in subsequent unload cycles. For example, in this waveform, there are three scan data out channels which are shown with strobe points. For example, the highlighted section (dashed ovals) shows that initial cycles are failing upon transitioning from capture to shift out.

Figure 3:
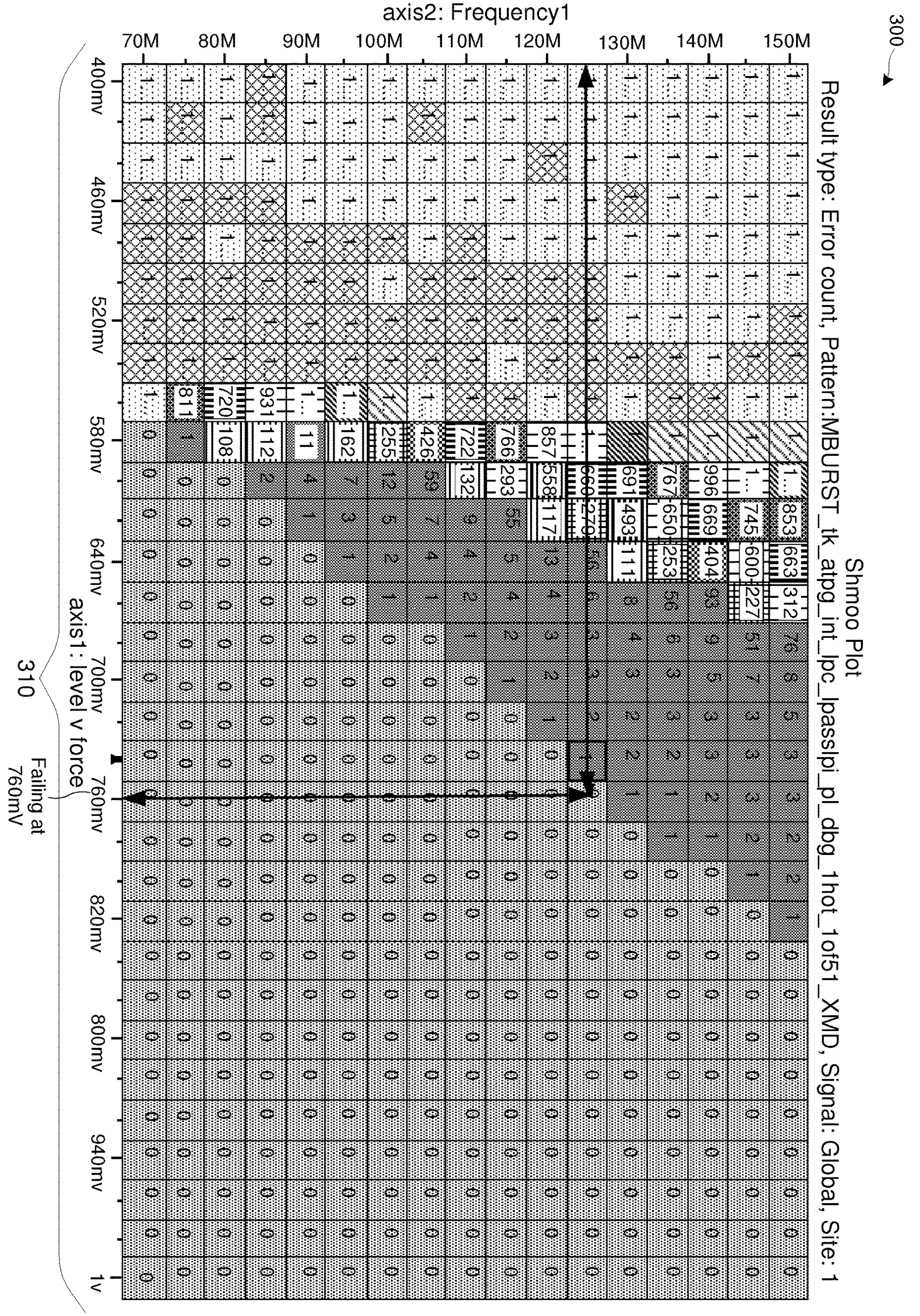
FIG. 3 illustrates an example comparison of two pattern shmoo plots.
Figure 3:
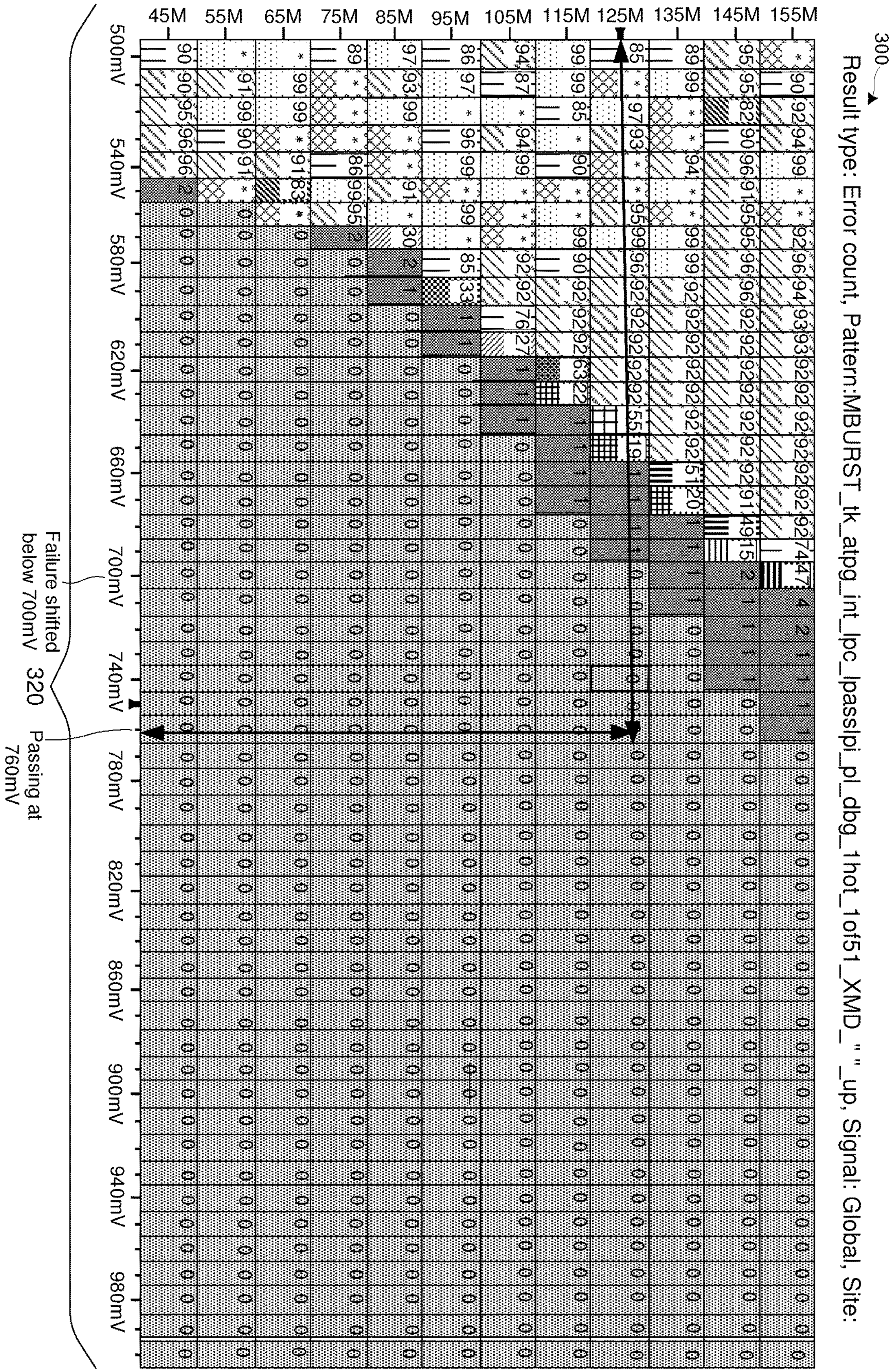

FIG. 3 illustrates an example comparison 300 of two pattern shmoo plots. In one example, a pattern shmoo plot displays a first performance parameter vs. a second performance parameter. In one example, a first pattern shmoo plot 310 illustrates an original pattern shmoo and a second pattern shmoo plot 320 illustrates a hacked one hot pattern shmoo plot. In one example, the comparison of two pattern shmoo plots 310, 320 includes one enabled scan chain and other scan chains which are disabled to provide better graphical visibility of transient effects. In one example, a minimum voltage threshold improves from 760 mV to 700 mV when enabling test clock toggles during dummy cycles prior to data capture. For example, the graphical boxes include a numeral which indicates error count. For example, boxes with 0 indicate test passing. Other non-zero boxes indicate failing regions with different error counts.

In one example, voltage droop may be mitigated using a variable shift frequency in an LBIST clock. For example, an LBIST clock may be modified using a divided clock option for LBIST capture and initial load/unload cycles. In one example, a user may program a number of shift cycles on a slow clock to mitigate voltage droop while transitioning from scan capture to load/unload.

In one example, a slow cycle programmer may be triggered by a LBIST capture count enable control signal to enable or disable a fast clock to slow clock transition. In one example, the slow clock may have a plurality of programmable integer divisors such as 2, 3, 4, 8, etc. In one example, the plurality of programmable integer divisors may be limited to restrict a circuit delay by no more than a maximum divisor.

Figure 4:
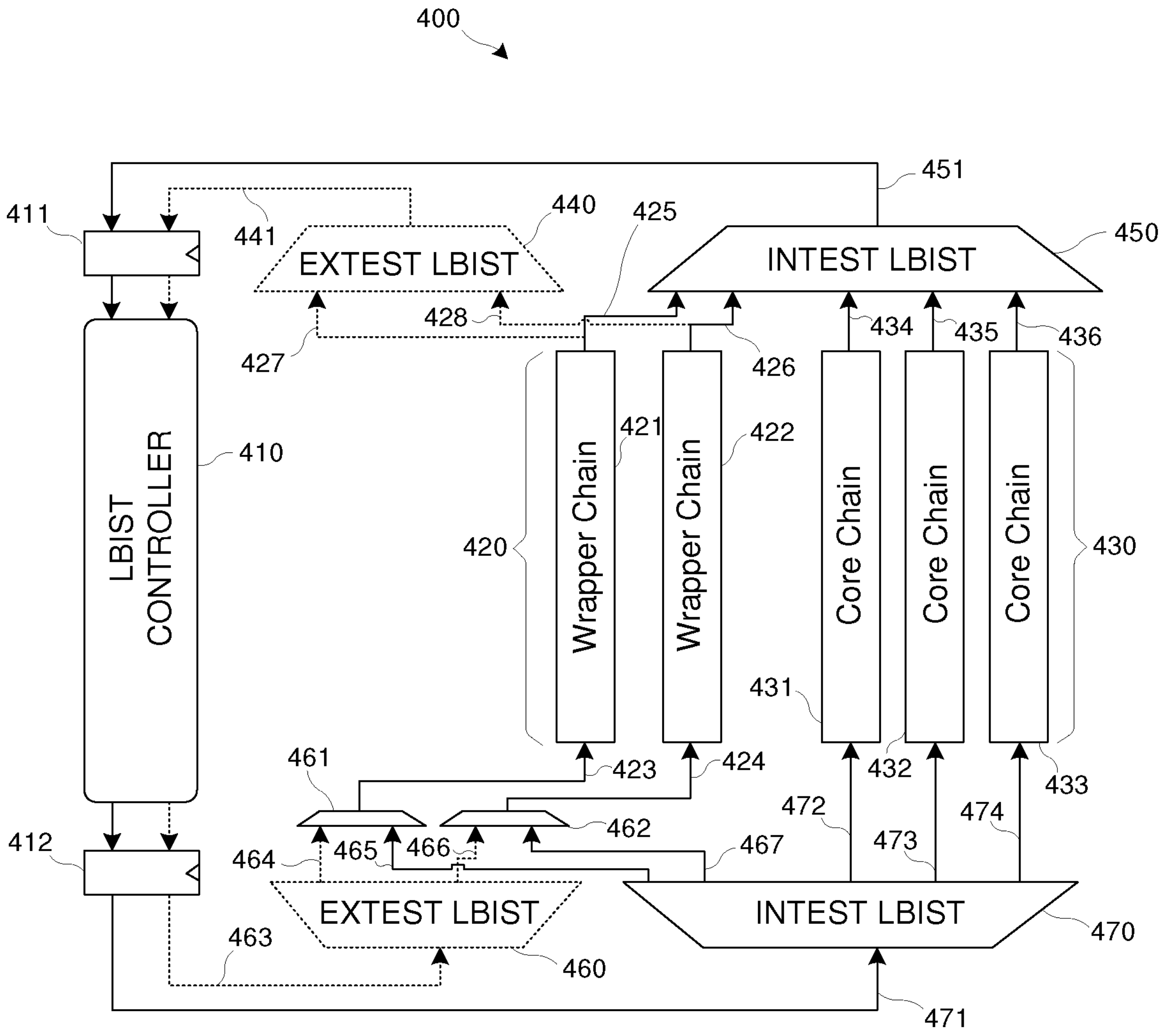
FIG. 4 illustrates an example voltage droop mitigation solution.

FIG. 4 illustrates an example voltage droop mitigation solution 400. In one example, the voltage droop mitigation solution 400 includes an LBIST controller 410, a plurality of wrapper chains 420, a plurality of core chains 430, an external LBIST input multiplexer 460, an internal LBIST input multiplexer 470, an external LBIST output multiplexer 440, and an internal LBIST output multiplexer 450. In one example, the LBIST controller 410 is connected to an output interface module 412 to produce an internal LBIST input control signal 471 to the internal LBIST input multiplexer 470 and an external LBIST input control signal 463 to the external LBIST input multiplexer 460.

In one example, the external LBIST input multiplexer 460 produces a first external LBIST input control signal 464 and a second external LBIST input control signal 466 from the external LBIST input control signal 463. In one example, the internal LBIST input multiplexer 470 produces a first internal LBIST input control signal 465, a second internal LBIST input control signal 467, a third internal LBIST input control signal 472, a fourth internal LBIST input control signal 473 and a fifth internal LBIST input control signal 474 from the internal LBIST input control signal 471.

In one example, a first combiner 461 aggregates the first external LBIST input control signal 464 and the first internal LBIST input control signal 465 to produce a first LBIST input control signal 423. In one example, a second combiner 462 aggregates the second external LBIST input control signal 466 and the second internal LBIST input control signal 467 to produce a second LBIST input control signal 424.

In one example, the first LBIST input control signal 423 is an input for a first wrapper chain 421 of the plurality of wrapper chains 420 and the second LBIST input control signal 424 is an input for a second wrapper chain 424 of the plurality of wrapper chains 420.

In one example, the third internal LBIST input control signal 472 is an input for a first core chain 431 of the plurality of core chains 430, the fourth internal LBIST input control signal 473 is an input for a second core chain 432 of the plurality of core chains 430 and the fifth internal LBIST input control signal 474 is an input for a third core chain 433 of the plurality of core chains 430.

In one example, the first wrapper chain 421 provides a first external LBIST output control signal 427 and a first internal LBIST output control signal 425. In one example, the second wrapper chain 422 provides a second external LBIST output control signal 428 and a second internal LBIST output control signal 426. In one example, the first core chain 431 provides a third internal LBIST output control signal 434, the second core chain 432 provides a fourth internal LBIST output control signal 435 and the third core chain 433 provides a fifth internal LBIST output control signal 436.

In one example, the voltage droop mitigation solution relies on a variable shift frequency implementation. The variable shift frequency implementation modifies LBIST clocking with a divided clock option for LBIST scan capture and initial load/unload cycles. For example, a user can program a quantity of shift cycles on a slow clock (i.e., divided clock) to mitigate voltage droop while moving from scan capture to load/unload cycles. In one example, a slow cycle programmable (SCP) which is triggered by a capture count enable signal to enable/disable a fast to slow clock transition. For example, the user may select among a plurality of programmable integer divisors (e.g., 2, 3, 4, 8, etc.) for the divided clock.

Figure 5:
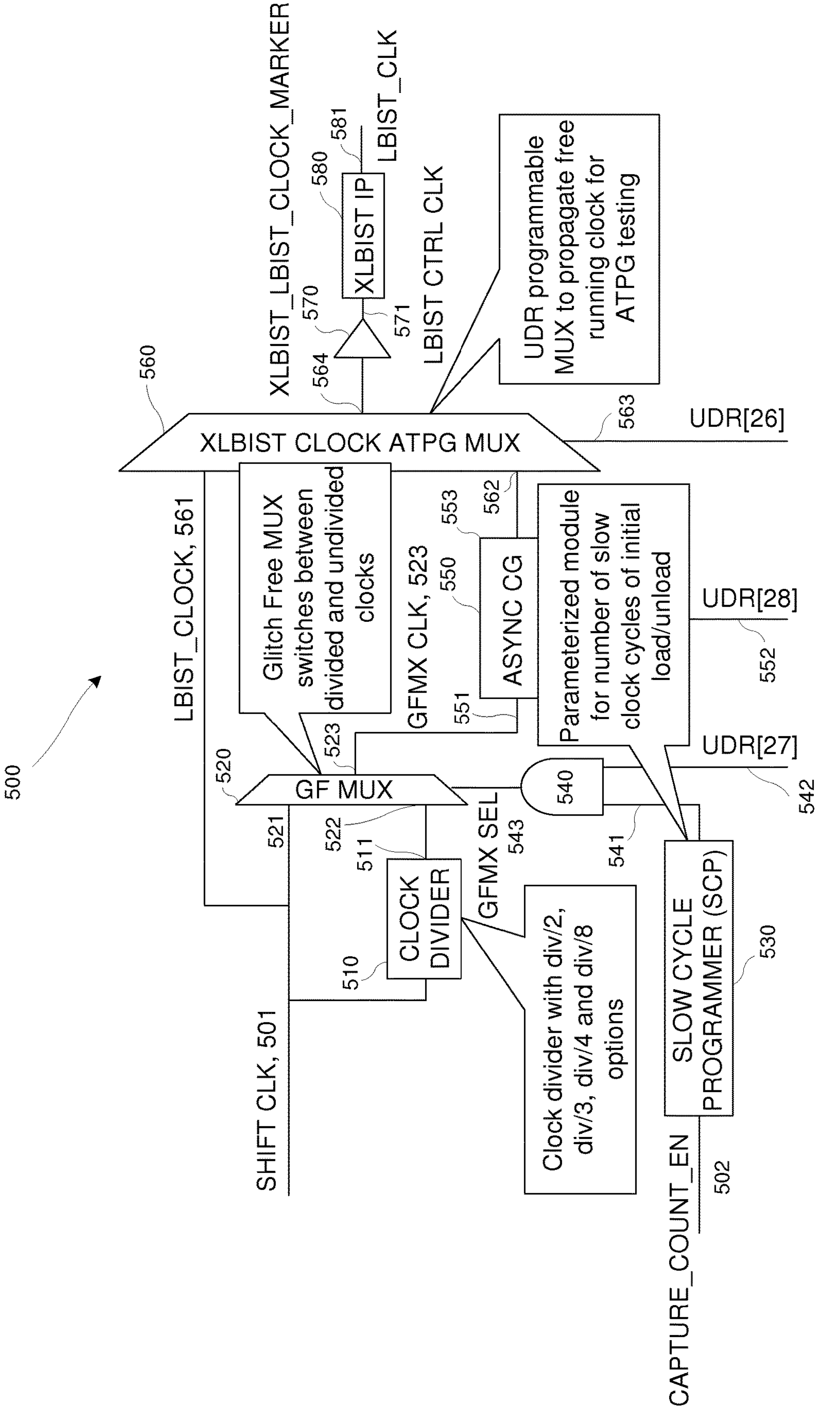
FIG. 5 illustrates an example variable shift frequency implementation.

FIG. 5 illustrates an example variable shift frequency implementation 500. In one example, a shift clock 501 (e.g., a reference clock) is sent to a first input terminal 521 of a glitch-free multiplexer 520 and to a clock divider 510. For example, the shift clock 501 may have a reference frequency of 125 MHz. In one example, the clock divider 510 provides a divided clock 511 which is sent to a second input terminal 522 of the glitch-free multiplexer 520. In one example, the clock divider 510 is a programmable clock divider with a plurality of programmable integer divisors. In one example, the plurality of programmable integer divisors includes 2, 3, 4, 8, etc. In one example, the plurality of programmable integer divisors may be limited to a maximum integer divisor (e.g., 8) to restrict a circuit delay to a maximum circuit delay value. In one example, a selected integer divisor is one of the plurality of programmable integer divisors used for an LBIST mode. In one example, the divided clock 511 has a divided frequency equal to the reference frequency divided by the selected integer divisor.

In one example, the glitch-free multiplexer 520 provides a multiplexer output 523 which is selected between the first input terminal 521 and the second input terminal 522 depending on a logical state of a multiplexer select signal 543.

In one example, a capture count enable signal 502 is a trigger signal for a slow cycle programmer (SCP) 530. In one example, the SCP 530 provides an integer count of slow clock cycles of an initial load/unload operation. In one example, an output of the SCP 530 is sent as a first logical input 541 of an AND logical gate 540, and a first user defined state (e.g. UDR[27]) is sent as a second logical input 542 of the AND logical gate 540. In one example, the AND logical gate 540 has a HIGH output state if both the output of the SCP 530 and the first user defined state 542 (e.g., UDR[27]) are set to a HIGH state. In one example, the HIGH output state of the AND logical gate 540 corresponds to selection of the divided clock 511. Otherwise, the AND logical gate 540 has a LOW output state.

In one example, if the AND logical gate 540 has a HIGH output state, the multiplexer select signal 543 is set to a HIGH state which selects the second input terminal 522 which is the divided clock 511. In one example, if the AND logical gate 540 has a LOW output state, the multiplexer select signal 543 is set to a LOW state which selects the first input terminal 521 which is the shift clock 501. That is, either the divided clock 511 or the shift clock 501 is selected as the multiplexer output 523 depending on the output state of the AND logical gate 540.

In one example, the multiplexer output 523 is sent to a clock generator input 551 of an asynchronous clock generator 550 to produce a free-running clock 553. In one example, the asynchronous clock generator 550 does not execute clock transitions with a common time alignment to other clock signals. For example, the free-running clock 553 is sourced from an independent frequency reference, which may be an internal frequency reference. In one example, the asynchronous clock generator 550 may be enabled by a second user defined state 552.

In one example, an automatic test pattern generator (ATPG) multiplexer 560 has a first ATPG mux input 561 connected to the shift clock 501 and a second ATPG mux input 562 connected to the free-running clock 553. In one example, the ATPG multiplexer 560 has an ATPG mux output 564 which is either connected to the first ATPG mux input 561 or the second ATPG mux input 562, depending on a third user defined state 563 (e.g., UDR[26]). In one example, if the third user defined state 563 is at a LOW state, then the shift clock 501 appears at the ATPG mux output 564. In one example, if the third user defined state 563 is at a HIGH state, then the free-running clock 553 appears at the ATPG mux output 564.

In one example, the ATPG mux output 564 is sent to a clock buffer 570 to provide a buffered clock input 571 to an LBIST module 580. In one example, the LBIST module 580 provides a LBIST clock 581 to LBIST circuitry (not shown).

Figure 6:
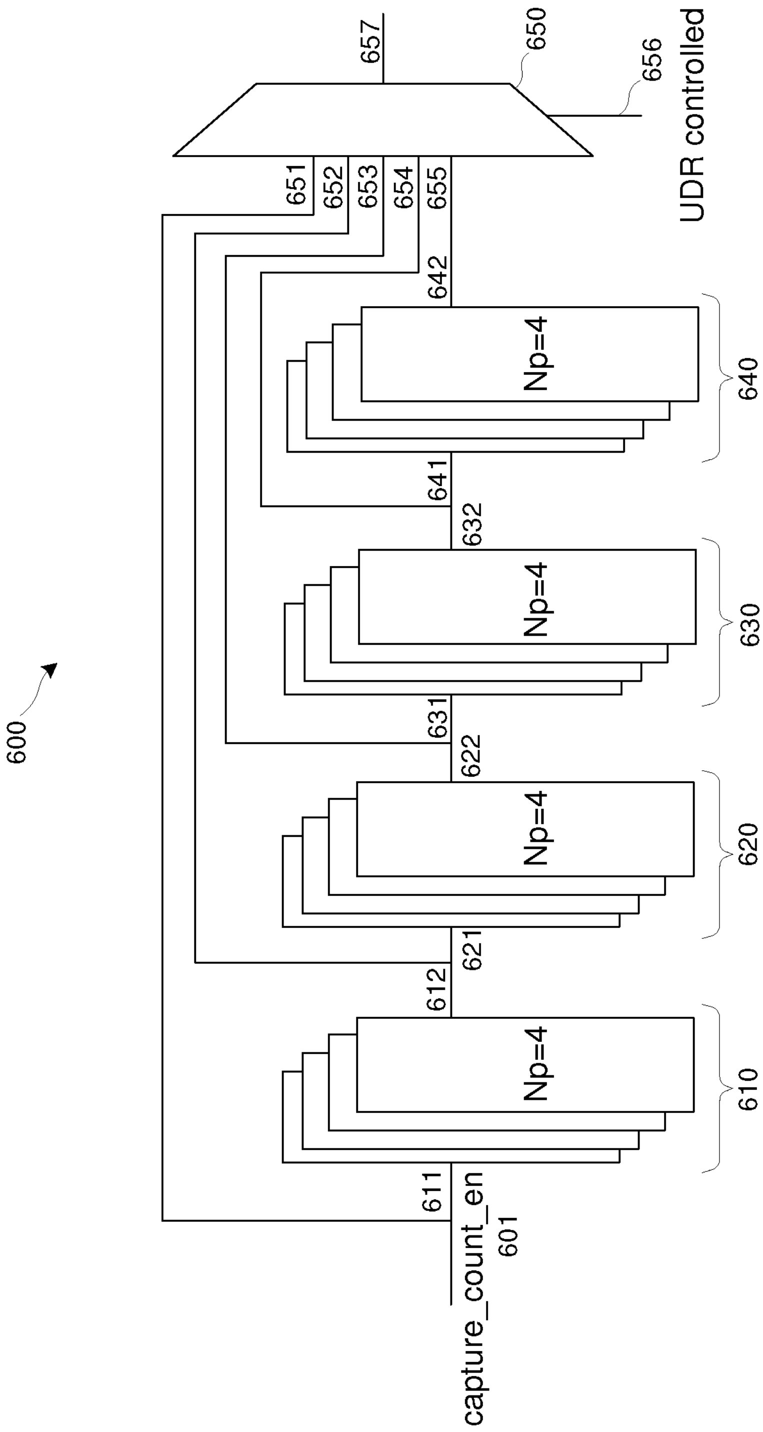
FIG. 6 illustrates an example slow cycle programmer (SCP).

FIG. 6 illustrates an example slow cycle programmer (SCP) 600. In one example, the SCP 600 includes a first quad stage pipeline 610, a second quad stage pipeline 620, a third quad stage pipeline 630 and a fourth quad stage pipeline 640. In one example, a quad stage pipeline is a cascaded delay module with four stages of circuit delay, where each stage has an incremental delay of $\Delta\tau$. That is, each quad stage pipeline has a quad stage delay of $4\Delta\tau$. In one example, the first quad stage pipeline 610, the second quad stage pipeline 620, the third quad stage pipeline 630 and the fourth quad stage pipeline 640 are configured in a cascaded serial manner to implement a programmable pipeline delay.

In one example, a capture count enable signal 601 is a first pipeline input 611 for the first quad stage pipeline 610 to produce a first pipeline output 612. In one example, the first pipeline output 612 is a second pipeline input 621 for the second quad stage pipeline 620 to produce a second pipeline output 622. In one example, the second pipeline output 622 is a third pipeline input 631 for the third quad stage pipeline 630 to produce a third pipeline output 632. In one example, the third pipeline output 632 is a fourth pipeline input 641 for the fourth quad stage pipeline 640 to produce a fourth pipeline output 642.

In one example, the capture count enable signal 601 serves as a first mux input 651 of an output multiplexer 650, the first pipeline output 612 serves as a second mux input 652 of the output multiplexer 650, the second pipeline output 622 serves as a third mux input 653 of the output multiplexer 650, the third pipeline output 632 serves as a fourth mux input 654 of the output multiplexer 650 and the fourth pipeline output 642 serves as a fifth mux input 655 of the output multiplexer 650.

In one example, a mux output 657 of the output multiplexer 650 is selected by a multiplexer select signal 656. In one example, the multiplexer select signal 656 may be controlled by contents of a user data register (UDR). For example, the multiplexer select signal 656 may select the first pipeline output 612 to achieve a single quad stage delay of $4\Delta\tau$. For example, the multiplexer select signal 656 may select the second pipeline output 622 to achieve a 2 times quad stage delay of $8\Delta\tau$. For example, the multiplexer select signal 656 may select the third pipeline output 632 to achieve a 3 times quad stage delay of 12Δτ. For example, the multiplexer select signal 656 may select the fourth pipeline output 642 to achieve a 4 times quad stage delay of 16Δτ.

In one example, a glitch-free multiplexer should select a divided clock during a capture phase and for a few initial load/unload cycles. The capture count enable signal 601 is at a HIGH state during the capture phase and during the few initial load/unload cycles. In one example, a parameterized number of pipeline stages may be added to the capture count enable signal 601. In one example, a final output for selection of the glitch-free multiplexer is a logical OR operation of the capture count enable signal 601 and an output of a last pipeline stage.

Figure 7:
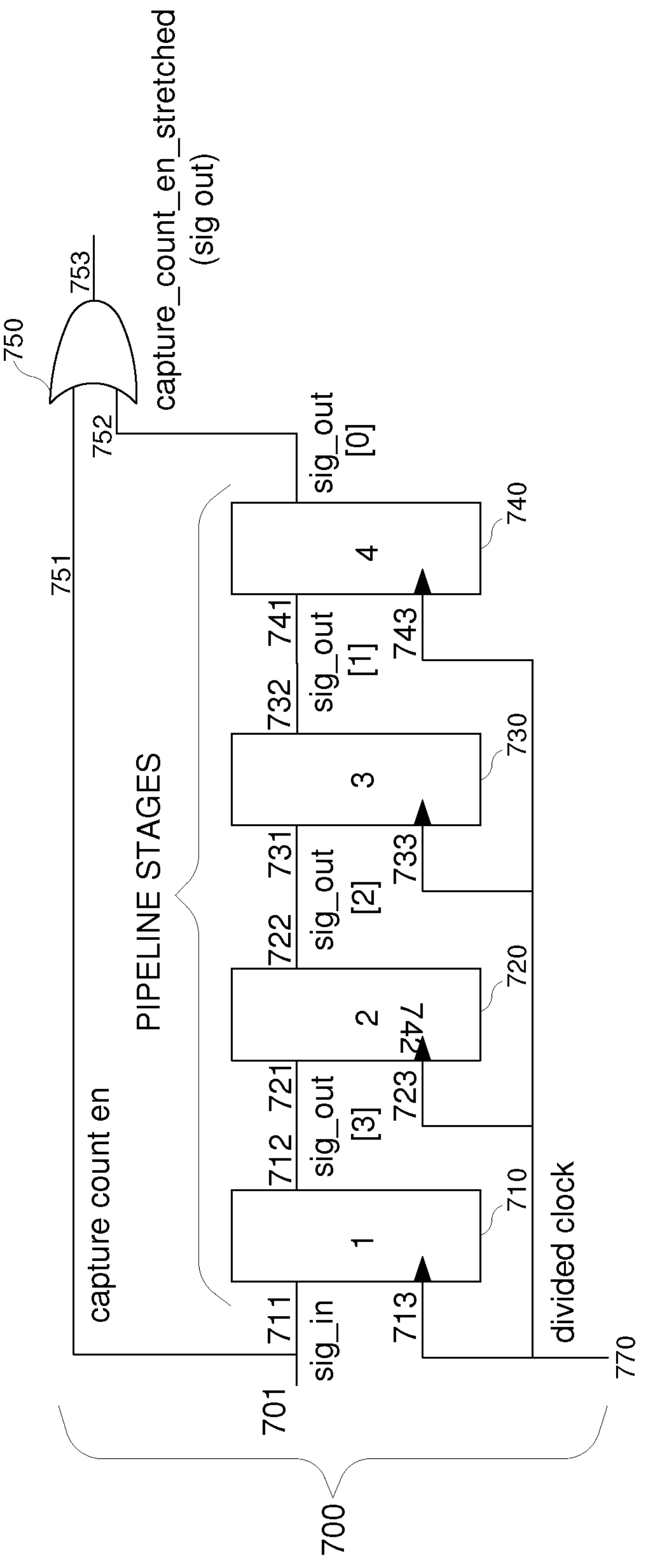
FIG. 7 illustrates an example quad stage pipeline.

FIG. 7 illustrates an example quad stage pipeline 700. In one example, a capture count enable signal 701 is a first stage input 711 to a first stage 710 of the quad stage pipeline 700 to produce a first stage output 712. In one example, the first stage output 712 is delayed by an incremental delay of Δτ relative to the first stage input 711. In one example, the first stage output 712 is a second stage input 721 to a second stage 720 of the quad stage pipeline 700 to produce a second stage output 722. In one example, the second stage output 722 is delayed by an incremental delay of Δτ relative to the second stage input 721. In one example, the second stage output 722 is a third stage input 731 to a third stage 730 of the quad stage pipeline 700 to produce a third stage output 732. In one example, the third stage output 732 is delayed by an incremental delay of Δτ relative to the third stage input 731. In one example, the third stage output 732 is a fourth stage input 741 to a fourth stage 740 of the quad stage pipeline 700 to produce a fourth stage output 742. In one example, the fourth stage output 742 is delayed by an incremental delay of Δτ relative to the fourth stage input 741. That is, in one example, the fourth stage output 742 is delayed by a net delay of 4Δτ relative to the first stage input 711 (i.e., a quad stage pipeline).

In one example, a logical OR gate 750 has a first gate input 751 fed by the capture count enable signal 701 and a second gate input 752 fed by the fourth stage output 742 to produce a stretched capture count enable signal 753. In one example, the stretched capture count enable signal 753 is at a LOW level if and only if both the capture count enable signal 701 is at a LOW level and the fourth stage output 742 is at a LOW level. In one example, the stretched capture count enable signal 753 is at a HIGH level if the capture count enable signal 701 is at a HIGH level and/or the fourth stage output 742 is at a HIGH level.

In one example, a divided clock 770 is supplied to a first clock input 713 for the first stage 710, to a second clock input 723 for the second stage 720, to a third clock input 733 for the third stage 730 and to a fourth clock input 743 for the fourth stage 740. In one example, the divided clock 770 has a divided frequency equal to a reference frequency divided by a selected integer divisor.

Figure 8:
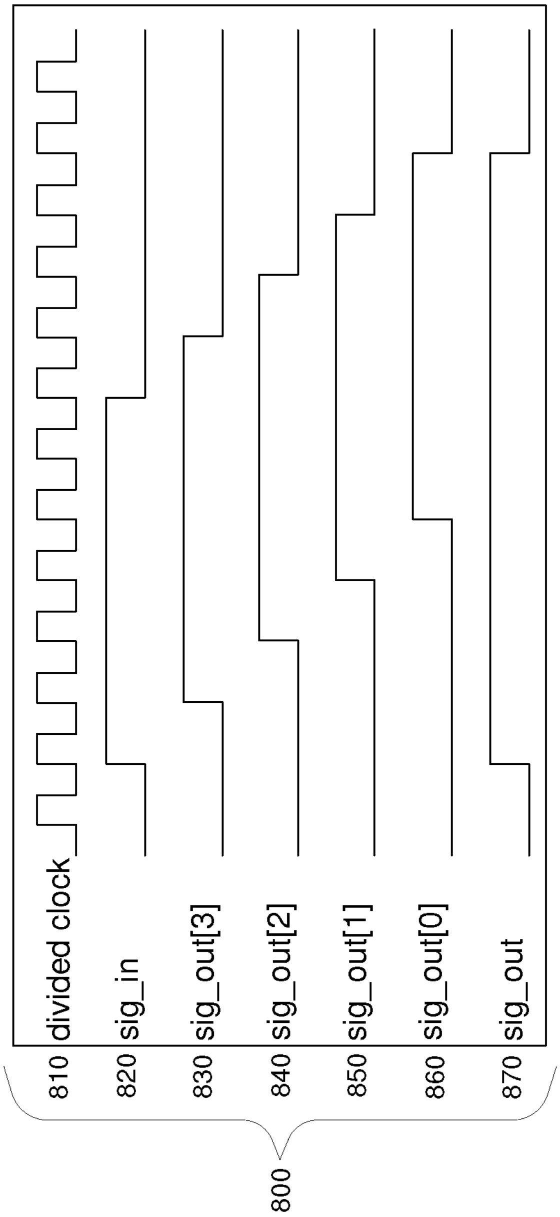
FIG. 8 illustrates example waveform traces for a quad stage pipeline.

FIG. 8 illustrates example waveform traces 800 for a quad stage pipeline. In one example, the example waveform traces 800 include a divided clock trace 810. In one example, the example waveform traces 800 include a capture count enable signal trace 820. In one example, the example waveform traces 800 include a first stage output trace 830. In one example, the example waveform traces 800 include a second stage output trace 840. In one example, the example waveform traces 800 include a third stage output trace 850. In one example, the example waveform traces 800 include a fourth stage output trace 860. In one example, the example waveform traces 800 include a stretched capture count enable signal trace 870. In one example, the example waveform traces 800 show that the stretched capture count enable signal trace 870 extends the capture count enable signal trace 820 by four divided clock cycles as implemented by a quad stage pipeline.

Figure 9:
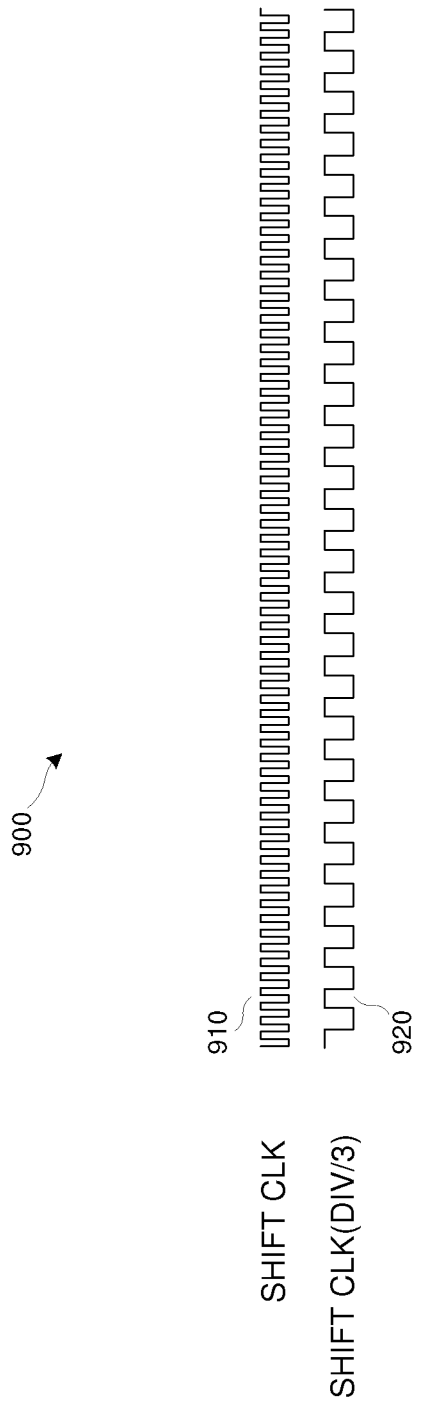
FIG. 9 illustrates example clock waveforms.

FIG. 9 illustrates example clock waveforms 900. In one example, the example clock waveforms 900 includes a reference clock waveform 910 (e.g., shift clock waveform) and a divided clock waveform 920. For example, if the reference clock waveform 910 has a reference frequency of 125 MHz and the divided clock waveform 920 has divided clock frequency of 125 MHz/3=41.67 MHz if a selected integer divisor is equal to 3.

Figure 10:
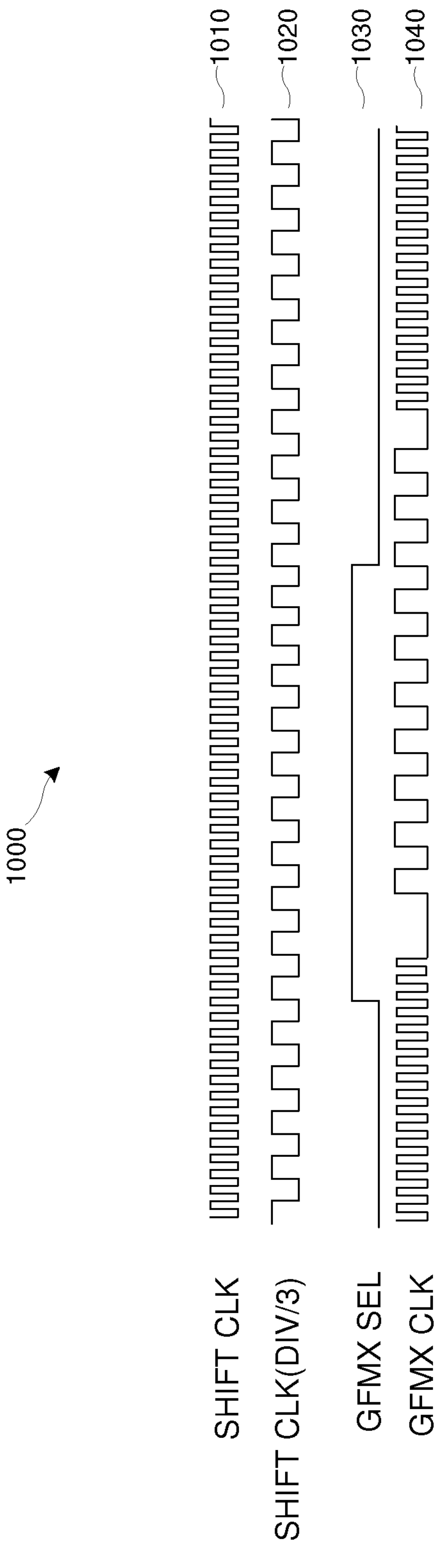
FIG. 10 illustrates example glitch-free multiplexer waveforms.

FIG. 10 illustrates example glitch-free multiplexer waveforms 1000. In one example, the example glitch-free multiplexer waveforms 1000 includes a reference clock waveform 1010, a divided clock waveform 1020, a mux select signal 1030 and a mux clock signal 1040. In one example, the mux clock signal 1040 switches between the reference clock waveform 1010 and the divided clock waveform with three dead clock cycles taken for every transition between multiplexer inputs for synchronization on an output clock. In one example, a slow cycle programmer (SCP) extends the mux select signal 1030 with 4 pipeline stages.

Figure 11:
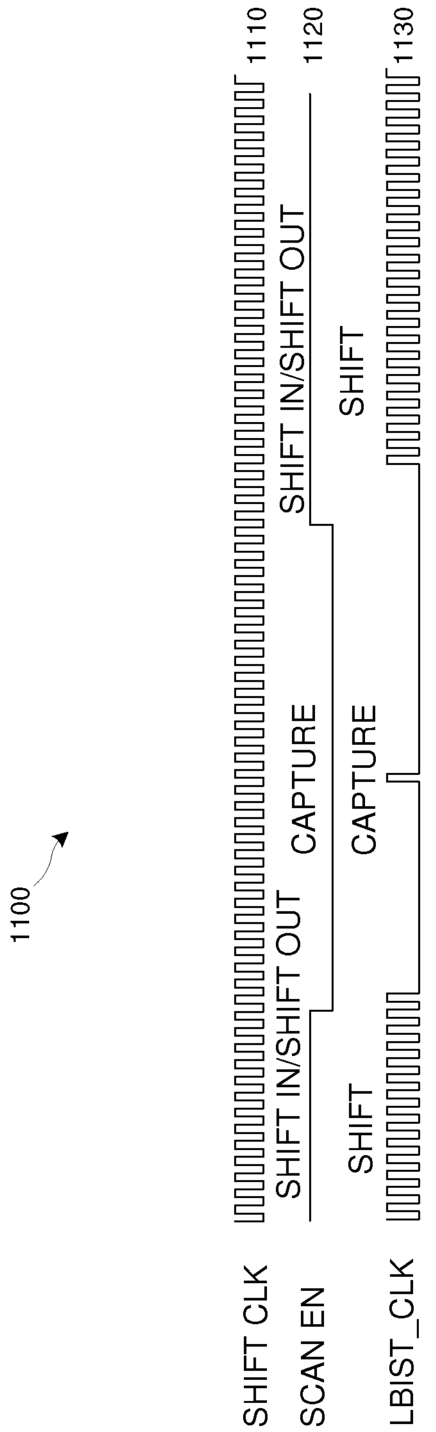
FIG. 11 illustrates example baseline shift and capture mode waveforms.

FIG. 11 illustrates example baseline shift and capture mode waveforms 1100. In one example, the baseline shift and capture mode waveforms 1100 include a reference clock waveform 1110, a scan enable signal 1120 and a LBIST clock signal 1130.

Figure 12:
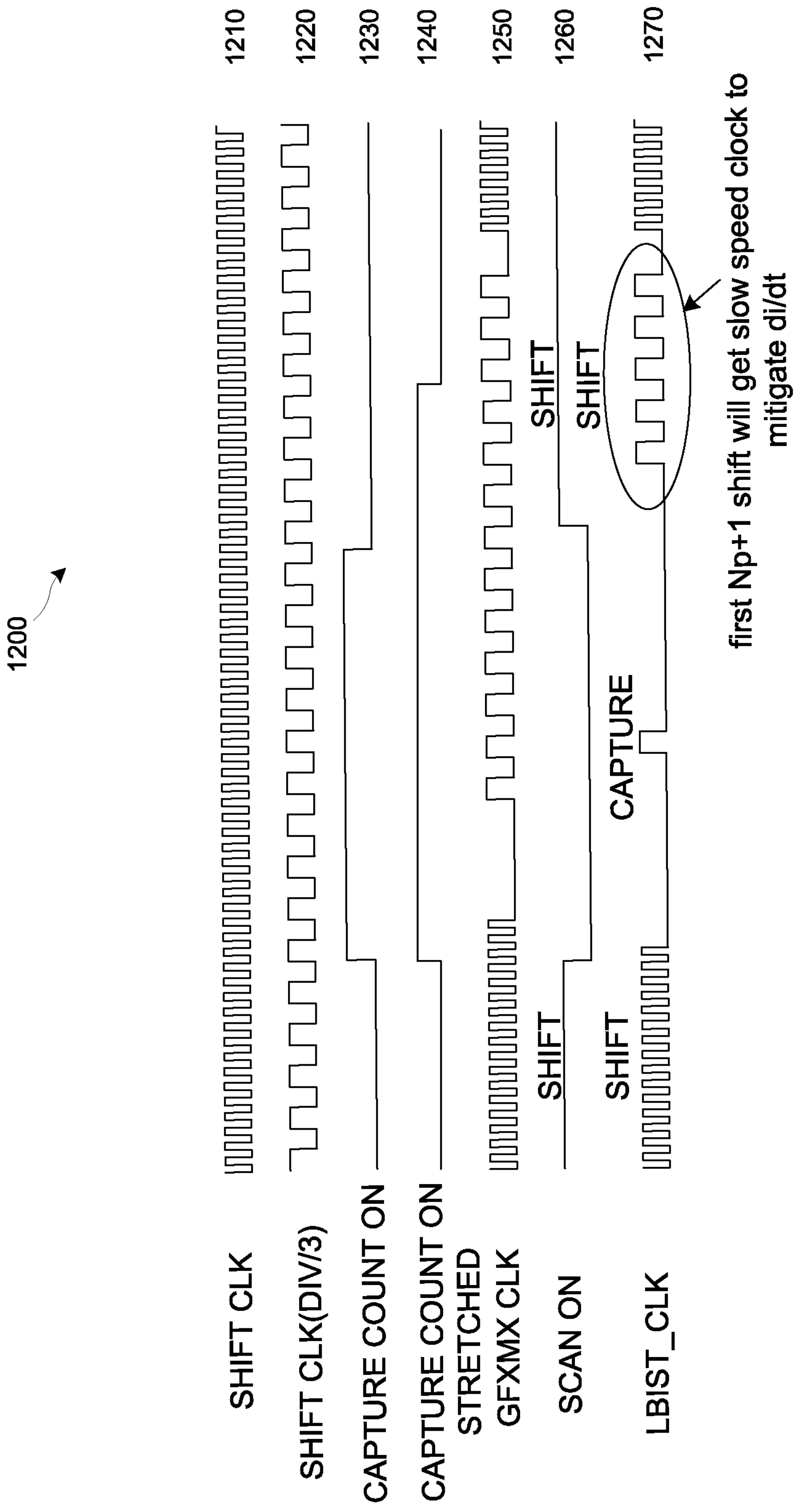
FIG. 12 illustrates example slow cycle programmer (SCP)-enabled shift and capture mode waveforms.

FIG. 12 illustrates example slow cycle programmer (SCP)-enabled shift and capture mode waveforms 1200. In one example, the SCP-enabled shift and capture mode waveforms 1200 include a reference clock waveform 1210, a divided clock waveform 1220, a capture count enable signal 1230, a stretched capture count enable signal 1240, a glitch-free mux clock signal 1250, a scan enable signal 1260 and a LBIST clock signal 1270. In one example, the LBIST clock signal 1270 shows a slow speed clock at a fifth stage shift for a single quad stage pipeline implementation.

Figure 13:
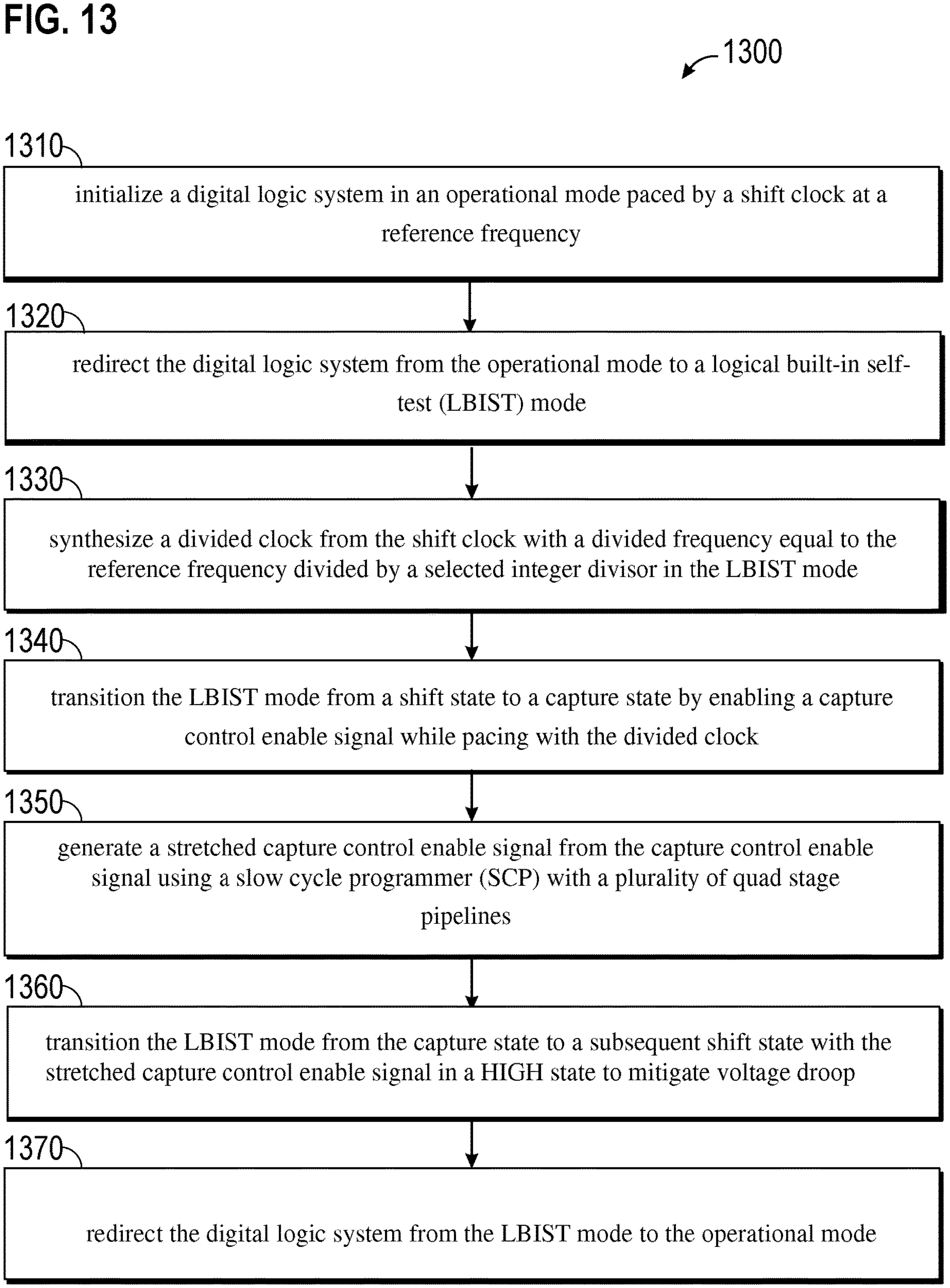
FIG. 13 illustrates an example flow diagram 1300 for implementing a variable shift frequency implementation in logical built-in self-test (LBIST) mode.

FIG. 13 illustrates an example flow diagram 1300 for implementing a variable shift frequency implementation in logical built-in self-test (LBIST) mode. In block 1310, initialize a digital logic system in an operational mode paced by a shift clock at a reference frequency. In one example, a digital logic system is initialized in an operational mode paced by a shift clock at a reference frequency. In one example, the digital logic system is a combinatorial circuit or a sequential circuit. In one example, the shift clock is a reference clock for the digital logic system. In one example, the operational mode is selected by using a control line to set a multiplexer input state to an operational state. In one example, the multiplexer input state is selected by a controller. In one example, the step of block 1310 is performed by a processing engine or a CPU.

In block 1320, redirect the digital logic system from the operational mode to a logical built-in self-test (LBIST) mode. In one example, the digital logic system is redirected from the operational mode to a logical built-in self-test (LBIST) mode. In one example, the LBIST mode is selected by using the control line to set the multiplexer input state to a test state. In one example, the test state connects a plurality of scan chain inputs to a digital pattern sequence generator. In one example, the digital pattern sequence generator is a pseudo random pattern generator (PRPG). In one example, the test state connects the plurality of scan chain inputs to a scan decompressor. In one example, the step of block 1320 is performed by a controller, a processing engine or a CPU.

In block 1330, synthesize a divided clock from the shift clock with a divided frequency equal to the reference frequency divided by a selected integer divisor in the LBIST mode. In one example, a divided clock is synthesized from the shift clock with a divided frequency equal to the reference frequency divided by a selected integer divisor in the LBIST mode.

In one example, the selected integer divisor is selected from a plurality of programmable integer divisors. In one example, the plurality of programmable integer divisors includes 2, 3, 4, 8, etc. In one example, a quantity of the plurality of programmable integer divisors may be limited to a maximum integer divisor (e.g., 8) to restrict a circuit delay to a maximum circuit delay value. In one example, the divided clock is synthesized using a programmable clock divider. In one example, the step of block 1330 is performed by a programmable clock divider, a frequency synthesizer, or a frequency divider chain.

In block 1340, transition the LBIST mode from a shift state to a capture state by enabling a capture control enable signal while pacing with the divided clock. In one example, the LBIST mode is transitioned from a shift state to a capture state by enabling a capture control enable signal while pacing with the divided clock. In one example, the shift state executes a plurality of self-test logical operations in the LBIST mode. In one example, the capture state executes a data acquisition in the LBIST mode. In one example, the divided clock is selected by a glitch-free multiplexer. In one example, the divided frequency of the divided clock is at a slower frequency than the reference frequency of the shift clock. In one example, the step of block 1340 is performed by a controller, a processing engine or a CPU.

In block 1350, generate a stretched capture control enable signal from the capture control enable signal using a slow cycle programmer (SCP) with a plurality of quad stage pipelines. In one example, a stretched capture control enable signal is generated from the capture control enable signal using a slow cycle programmer (SCP) with a plurality of quad stage pipelines.

In one example, the stretched capture control enable signal extends an active state (e.g., a HIGH state) for an extension duration across the capture state to a subsequent shift state. In one example, the extension duration is determined by a quantity of quad stage pipelines from the SCP. In one example, an active quantity of quad stage pipelines is determined by a user-defined parameter in a user defined register (UDR). In one example, an active quantity defined how many of a plurality of quad stage pipelines will be active. In one example, each quad stage pipeline of the plurality of quad stage pipelines introduces a net delay of four times an incremental delay per stage. In one example, the glitch-free multiplexer selection is governed by the stretched capture control enable signal. In one example, the step of block 1350 is performed by a slow cycle programmer, a plurality of quad stage pipelines, a plurality of shift registers or a plurality of delay elements.

In block 1360, transition the LBIST mode from the capture state to a subsequent shift state with the stretched capture control enable signal in an active state (e.g., a HIGH state) to mitigate voltage droop. In one example, the LBIST mode is transitioned from the capture state to a subsequent shift state with the stretched capture control enable signal in an active state (e.g., a HIGH state) to mitigate voltage droop.

In one example, the stretched capture control enable signal mitigates voltage droop in the subsequent shift state for an initial duration determined by the quantity of quad stage pipelines from the SCP. In one example, the initial duration includes initial load/unload cycles in the subsequent shift state. In one example, the step of block 1360 is performed by a controller, a processing engine or a CPU.

In block 1370, redirect the digital logic system from the LBIST mode to the operational mode. In one example, the digital logic system is redirected from the LBIST mode to the operational mode. In one example, the operational mode is paced using the shift clock at the reference frequency. In one example, the step of block 1370 is performed by a controller, a processing engine or a CPU.

In one aspect, one or more of the steps for providing a variable shift frequency implementation in logical built-in self-test (LBIST) mode in FIG. 13 may be executed by one or more processors which may include hardware, software, firmware, etc. The one or more processors, for example, may be used to execute software or firmware needed to perform the steps in the flow diagram of FIG. 13. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

The software may reside on a computer-readable medium. The computer-readable medium may be a non-transitory computer-readable medium. A non-transitory computer-readable medium includes, by way of example, a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The computer-readable medium may also include, by way of example, a carrier wave, a transmission line, and any other suitable medium for transmitting software and/or instructions that may be accessed and read by a computer. The computer-readable medium may reside in a processing system, external to the processing system, or distributed across multiple entities including the processing system. The computer-readable medium may be embodied in a computer program product. By way of example, a computer program product may include a computer-readable medium in packaging materials. The computer-readable medium may include software or firmware. Those skilled in the art will recognize how best to implement the described functionality presented throughout this disclosure depending on the particular application and the overall design constraints imposed on the overall system.

Any circuitry included in the processor(s) is merely provided as an example, and other means for carrying out the described functions may be included within various aspects of the present disclosure, including but not limited to the instructions stored in the computer-readable medium, or any other suitable apparatus or means described herein, and utilizing, for example, the processes and/or algorithms described herein in relation to the example flow diagram.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

One skilled in the art would understand that various features of different embodiments may be combined or modified and still be within the spirit and scope of the present disclosure.

What is claimed is:

1. An apparatus comprising:

a clock divider configured to generate a divided clock;

a glitch-free multiplexer coupled to the clock divider, the glitch-free multiplexer configured to output the divided clock; and a slow cycle programmer (SCP) coupled to the glitch-free multiplexer, the SCP configured to generate a stretched capture control enable signal from a capture control enable signal, wherein the stretched capture control enable signal extends an active state for the divided clock for an extension duration across a capture state to a subsequent shift state, wherein the divided clock includes a divided frequency equal to a reference frequency divided by a selected integer divisor in a logical built-in self-test (LBIST) mode.

2. The apparatus of claim 1, wherein the SCP comprises a plurality of quad stage pipelines, wherein each of the plurality of quad stage pipelines is a cascaded delay module of circuit delay stages.

3. The apparatus of claim 2, wherein the plurality of quad stage pipelines is configured in a cascaded serial manner to implement a programmable pipeline delay.

4. The apparatus of claim 3, further comprising a user data register (UDR) coupled to the glitch-free multiplexer, the UDR configured to determine an active quantity of the plurality of quad stage pipelines based on a predefined parameter.

5. The apparatus of claim 3, further comprising an output multiplexer coupled to the plurality of quad state pipelines, the output multiplexer configured to enable an active quantity of the plurality of quad state pipelines based on an external signal.

6. The apparatus of claim 5, wherein the external signal is received from a user data register (UDR) and the external signal carries a user defined parameter.

7. An apparatus comprising:

means for initializing a digital logic system in an operational mode paced by a shift clock at a reference frequency;

means for redirecting the digital logic system from the operational mode to a logical built-in self-test (LBIST) mode;

means for synthesizing a divided clock from the shift clock with a divided frequency equal to the reference frequency divided by a selected integer divisor in the LBIST mode;

means for transitioning the LBIST mode from a shift state to a capture state by enabling a capture control enable signal while pacing with the divided clock;

means for generating a stretched capture control enable signal from the capture control enable signal using a slow cycle programmer (SCP) with a plurality of quad stage pipelines;

means for transitioning the LBIST mode from the capture state to a subsequent shift state with the stretched capture control enable signal in a HIGH state to mitigate voltage droop; and means for redirecting the digital logic system from the LBIST mode to the operational mode.

8. The apparatus of claim 7, wherein the stretched capture control enable signal extends an active state for an extension duration across the capture state to the subsequent shift state.

9. The apparatus of claim 8, wherein the extension duration is determined by a quantity of the plurality of quad stage pipelines.

10. A method comprising:

synthesizing a divided clock from a shift clock with a divided frequency equal to a reference frequency divided by a selected integer divisor in a logical built-in self-test (LBIST) mode;

transitioning the LBIST mode from a shift state to a capture state by enabling a capture control enable signal while pacing with the divided clock;

generating a stretched capture control enable signal from the capture control enable signal using a slow cycle programmer (SCP) with a plurality of quad stage pipelines; and transitioning the LBIST mode from the capture state to a subsequent shift state with the stretched capture control enable signal in a HIGH state to mitigate voltage droop.

11. The method of claim 10, wherein the stretched capture control enable signal extends an active state for an extension duration across the capture state to the subsequent shift state.

12. The method of claim 11, wherein the extension duration is determined by a quantity of the plurality of quad stage pipelines from the slow cycle programmer (SCP).

13. The method of claim 12, further comprising selecting the selected integer divisor from a plurality of programmable integer divisors.

14. The method of claim 13, wherein the plurality of programmable integer divisors includes 2, 3, 4, and 8.

15. The method of claim 13, wherein a quantity of the plurality of programmable integer divisors is a maximum integer divisor to restrict a delay of the plurality of quad stage pipelines to a maximum delay value.

16. The method of claim 10, wherein the divided frequency of the divided clock is at a slower frequency than the reference frequency of the shift clock.

17. The method of claim 10, further comprising redirecting a digital logic system from an operational mode to the LBIST mode.

18. The method of claim 17, further comprising initializing the digital logic system in the operational mode paced by the shift clock at the reference frequency.

19. The method of claim 18, further comprising redirecting the digital logic system from the LBIST mode to the operational mode.

* * * * *